US012035559B2

(12) United States Patent
Xu et al.

(10) Patent No.: US 12,035,559 B2
(45) Date of Patent: Jul. 9, 2024

(54) FLEXIBLE SCREEN AND DISPLAY DEVICE

(71) Applicants: KUNSHAN NEW FLAT PANEL DISPLAY TECHNOLOGY CENTER CO., LTD, Jiangsu (CN); KUNSHAN GO-VISIONOX OPTO-ELECTRONICS CO., LTD, Jiangsu (CN)

(72) Inventors: Tong Xu, Kunshan (CN); Rui Liu, Kunshan (CN); Qiang Lu, Kunshan (CN); Qi Wang, Kunshan (CN); Weiguo Li, Kunshan (CN); Xingxing Yang, Kunshan (CN)

(73) Assignees: KUNSHAN NEW FLAT PANEL DISPLAY TECHNOLOGY CENTER CO., LTD, Kunshan (CN); KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 464 days.

(21) Appl. No.: 17/318,136

(22) Filed: May 12, 2021

(65) Prior Publication Data

US 2021/0265592 A1 Aug. 26, 2021

Related U.S. Application Data

(63) Continuation of application No. PCT/CN2019/101787, filed on Aug. 21, 2019.

(30) Foreign Application Priority Data

Feb. 23, 2019 (CN) .......................... 201910134530.8

(51) Int. Cl.
*H10K 50/842* (2023.01)
*H10K 50/86* (2023.01)
(Continued)

(52) U.S. Cl.
CPC ......... *H10K 50/8426* (2023.02); *H10K 50/86* (2023.02); *H10K 59/12* (2023.02);
(Continued)

(58) Field of Classification Search
CPC .................. H10K 50/00–88; H10K 59/00–95
See application file for complete search history.

(56) References Cited

U.S. PATENT DOCUMENTS

| 8,439,719 | B2 * | 5/2013 | Jung | H10K 50/8426 445/25 |
|---|---|---|---|---|
| 2007/0172971 | A1 * | 7/2007 | Boroson | H10K 50/8426 438/26 |
| 2015/0263310 | A1 | 9/2015 | Gong | |
| 2016/0209681 | A1 * | 7/2016 | Hung | B32B 37/0076 |
| 2018/0182984 | A1 | 6/2018 | Lim et al. | |

(Continued)

FOREIGN PATENT DOCUMENTS

| CN | 105304676 A | 2/2016 |
|---|---|---|
| CN | 107863002 A | 3/2018 |

(Continued)

OTHER PUBLICATIONS

International Search Report issued on Nov. 21, 2019 in corresponding International Application No. PCT/CN2019/101787; 7 pages.
(Continued)

*Primary Examiner* — Steven M Christopher
*Assistant Examiner* — Tyler J Wiegand
(74) *Attorney, Agent, or Firm* — Maier & Maier, PLLC

(57) ABSTRACT

A flexible screen and a display device. The flexible screen includes a substrate, a cover plate and a display unit located between the substrate and the cover plate, where the flexible screen further includes a sealing layer and an insulating flow blocking medium, the sealing layer is located between the substrate and the cover plate, and surrounds a periphery of the display unit, a gap is formed between the sealing layer and the display unit, and the flow blocking medium fills the gap to isolate the display unit from outside.

19 Claims, 3 Drawing Sheets

(51) Int. Cl.
*H10K 59/12* (2023.01)
*H10K 59/40* (2023.01)
*H10K 77/10* (2023.01)
*H10K 102/00* (2023.01)

(52) U.S. Cl.
CPC ........... *H10K 59/40* (2023.02); *H10K 77/111* (2023.02); *H10K 2102/311* (2023.02)

(56) References Cited

U.S. PATENT DOCUMENTS

| | | | |
|---|---|---|---|
| 2019/0131551 A1* | 5/2019 | Xie | C08G 73/1067 |
| 2020/0058899 A1* | 2/2020 | Bu | B32B 7/06 |
| 2020/0219941 A1* | 7/2020 | Chiang | H10K 59/131 |

FOREIGN PATENT DOCUMENTS

| | | |
|---|---|---|
| CN | 109273481 A | 1/2019 |
| CN | 109360841 A | 2/2019 |
| CN | 109860257 A | 6/2019 |
| CN | 109920331 A | 6/2019 |
| WO | 2017159503 A1 | 9/2017 |

OTHER PUBLICATIONS

Office Action issued on Dec. 6, 2019 in corresponding Taiwanese Application No. 201910134530.8; 5 pages.
Office Action issued on Mar. 16, 2020 in corresponding Chinese Application No. 201910134530.8; 6 pages.

* cited by examiner

FLEXIBLE SCREEN AND DISPLAY DEVICE

CROSS-REFERENCE TO RELATED APPLICATIONS

This application is a continuation application of the International application PCT/CN2019/101787, filed on Aug. 21, 2019, which claims priority to Chinese patent application No. 201910134530.8 filed on Feb. 23, 2019. Both applications are hereby incorporated by reference in their entireties.

TECHNICAL FIELD

The present disclosure relates to the field of display technologies, and particularly to a flexible screen and a display device.

BACKGROUND

With the continuous development of technology, flexible screens, as an important development trend for mobile electronic products, have received more and more attention.

At present, a flexible screen usually adopts devices such as an organic light-emitting diode (Organic Light-Emitting Diode, OLED) to form a display unit. The display unit is disposed on a substrate, and a cover plate is disposed on a side of the display unit facing away from the flexible substrate, such that the display unit is packaged as a whole screen body. Both the cover plate and the substrate are made of bendable flexible materials in order to meet dynamic bending and folding requirements of the flexible screen.

However, since the flexible screen will bend when put into use, it is not easy to be sealed.

SUMMARY

Embodiments of the present disclosure provide a flexible screen and a display device, which have relatively good waterproof and sealing performance.

The flexible screen provided in the present disclosure can overcome the problem that, due to displacement and deformation of an existing flexible screen during a bending process, it is difficult to seal a display unit at its circumference so that the outside water vapor and impurities easily enter the inside of the flexible screen laterally.

In a first aspect, the present disclosure provides a flexible screen including a substrate, a cover plate and a display unit located between the substrate and the cover plate, where the flexible screen further includes a sealing layer and insulating flow blocking medium.

According to the flexible screen in the present disclosure, by enclosing a sealing layer at the periphery of the display unit, and filling the gap formed between the sealing layer and the display unit with a flow blocking medium, the display unit is isolated from the outside by the sealing layer and the flow blocking medium. Compared to the prior art in which only the sealing layer is enclosed at the periphery of the display unit, in the present disclosure, by filling the gap formed between the sealing layer and the display unit with the flow blocking medium, a sealing area located at the periphery of the display unit has relatively good deformability during a bending process. The arrangement of the flow blocking medium enables the sealing area to be shape-adjusted with movement and deformation of the substrate, the cover plate and the display unit accordingly, effectively avoiding a problem that sealability of the display unit at the periphery is affected due to the displacement and deformation at various parts of the flexible screen during the bending process, improving the sealing stability of the display unit at the periphery, thereby preventing the outside water vapor and impurities from entering the inside of the flexible screen laterally. In addition, the flow blocking medium itself has relatively high sealability, which further improves the sealing effect of the flexible screen.

Optionally, the gap surrounds a circumferential periphery of the display unit. In this way, circumferential edges of the display unit in any direction will be protected by the flow blocking medium, and the flow blocking medium has relatively good sealing and isolating effects.

Optionally, the flow blocking medium is in the gap between the optical clear adhesive and the sealing layer. The optical clear adhesive can isolate the flow blocking medium outside, and the optical clear adhesive and the sealing layer jointly enclose a dam-like structure, in this way, the flow blocking medium can be accommodated in the dam structure enclosed by the optical clear adhesive and the sealing layer, so that the flow blocking medium is limited and accommodated in the flexible screen.

Optionally, the sealing layer includes at least two sealing sublayers, the at least two sealing sublayers are laminatedly disposed in a direction perpendicular to the substrate, and are movable relative to each other. In this way, due to a relative movement between the sealing sublayers during the bending process, the overall movement or even the detachment of the sealing layer is avoided, and the stability of the sealing layer is improved, thereby ensuring the sealability of the flexible screen.

Optionally, the display unit includes at least two functional layers sequentially laminated in the direction perpendicular to the substrate, and one of the sealing sublayers is disposed at a periphery of each functional layer correspondingly.

In the present disclosure, by disposing one sealing sublayer at the periphery of each functional layer correspondingly, each functional layer disposed between the substrate and the cover plate can be effectively sealed at the periphery, at the same time, the multiple laminatedly disposed sealing sublayers can move relative to each other during the bending process, which effectively prevents the sealing layer located at the periphery of the display unit from being forced to move integrally or even detach due to movement and deformation of each part of the screen body during the bending, thereby improving the sealing effect of the sealing layer.

Optionally, the sealing layer is formed on the substrate, and extends upwardly from the substrate till a contact with the cover plate. In this way, the sealing layer will effectively seal the space formed between the substrate and the cover plate, thereby forming a relatively large sealing protection range, and realizing effective sealing and protection for each layer structure of the display unit formed on the substrate, and structures such as the touch component located between the display unit and the cover plate, and a polarizer, etc.

Optionally, the sealing layer includes close-cell foam. As such, not only the sealability of the sealing layer is ensured, but also the flow blocking medium is prevented from penetrating into the sealing layer, such that the flow blocking medium can be stably accommodated between the edge of the display unit and the sealing layer to ensure the sealing and buffering effects thereof, meanwhile the inability of the flow blocking medium to enter the sealing layer further prevents the sealing performance of the sealing layer from being affected.

Optionally, the sealing layer includes silicon or thermoplastic urethane elastomer rubber. In this way, on one hand, the silicon and the TPU have a relatively compact material, for both of which, it is not easy to allow outside water vapor or impurities to penetrate in, and the silicon and the TPU themselves have a certain degree of viscosity, which facilitate connection with the substrate or the cover plate; on the other hand, the silicon or the TPU has a relatively soft material, which may easily generate a corresponding deformation with the bending of the flexible screen.

Optionally, the flexible screen further includes a touch component and a first flexible circuit board. The touch component is disposed between the display unit and the cover plate, the first flexible circuit board and the touch component are signal-connected, the first flexible circuit board has a first connection terminal connected to the touch component, and an encapsulation coating for waterproofing is disposed at a junction of the touch component and the first flexible circuit board.

In this way, by disposing, at the junction of the touch component and the first flexible circuit board, an encapsulation coating for waterproofing, the sealability of the connection between the touch component and the first flexible circuit board is ensured, the water vapor is prevented from entering the inside of the flexible screen body from the connection so that a normal display is affected, and at the same time, since the encapsulation coating has a relatively thin thickness, there will be no interference on the upper structure of the cover plate.

Optionally, the encapsulation coating has a thickness of 0.5-20 μm. By setting the thickness of the encapsulation coating within this range, not only such a circumstance is avoided under which the encapsulation coating is so thick that a crack may easily happen, but also the encapsulation coating is prevented from being too thin to have the waterproof effect, effectively improving the structural stability of the encapsulation coating, and ensuring the waterproof effect of the encapsulation coating.

Optionally, the flexible screen further includes a second flexible circuit board which is configured to transmit a signal of the display unit; the second flexible circuit board has a second connection terminal connected to a terminal of the substrate, the second connection terminal and the first connection terminal of the first flexible circuit board do not overlap each other in a direction perpendicular to a surface of the substrate.

In the present disclosure, the first connection terminal of the first flexible circuit board and the second connection terminal of the second flexible circuit board are arranged such that they do not overlap each other in a direction perpendicular to the surface of the substrate plate, that is, the first flexible circuit board and the second flexible circuit board are in a staggered arrangement, which effectively avoids a slot generated when the first flexible circuit board and the second flexible circuit board are in an overlapping arrangement, making the assembly process relatively simple and easy, and producing a relatively good dustproof effect.

In this way, the first connection terminal of the first flexible circuit board for connection with the lead part of the screen body is divided into two parts to form a first connection portion and a second connection portion, so that the first connection portion, the second connection terminal, and the second connection portion are arranged in parallel along a direction perpendicular to the surface of the substrate, that is, a projection of the second connection terminal in the second flexible circuit board is located between projections of the first connection portion and the second connection portion, in this way, the first connection terminal of the first flexible circuit board and the second connection terminal of the second flexible circuit board are staggered in the direction perpendicular to the substrate, and there is no longer a relatively small gap or seam among the second connection terminal, the first connection portion and the second connection portion, making a more convenient and easier assembly with the touch component and the terminal of the substrate, and effectively improving the dustproof effect of the flexible screen.

In a second aspect, the present disclosure provides a display device, including the flexible screen as described above.

By disposing the above-mentioned flexible screen on a display device, even if the substrate, the display unit, or the cover plate is displaced or deformed when the flexible screen of the display device are bent, sealing can still be performed to the flexible screen, preventing the outside water vapor and impurities from entering the inside of the flexible screen laterally such that the display device has relative good waterproof and sealing performance.

The present disclosure provides a flexible screen and a display device. By enclosing a sealing layer at the periphery of the display unit, and filling the gap formed between the sealing layer and the display unit with a flow blocking medium, the display unit is isolated from the outside by the sealing layer and the flow blocking medium. In the present disclosure, the gap formed between the sealing layer and the display unit is filled with the flow blocking medium so that a sealing area located at the periphery of the display unit has relatively good deformability during a bending process, and the arrangement of the flow blocking medium enables the sealing area to be shape-adjusted with movement and deformation of the substrate, the cover plate and the display unit accordingly, effectively avoiding a problem that sealability of the display unit at the periphery is affected due to the displacement and deformation at various parts of the flexible screen during the bending process, and allowing the flexible screen to have relatively good waterproof and sealing performance.

BRIEF DESCRIPTION OF DRAWINGS

In order to more clearly illustrate the technical solutions of the embodiments of the present disclosure, the drawings required in the embodiment description will be briefly introduced below. Obviously, the drawings in the following description are only some embodiments of the present disclosure, rather than all the embodiments, for those of ordinary skill in the art, other drawings can be obtained based on the drawings without creative labor.

DETAILED DESCRIPTION OF EMBODIMENTS

In order to describe objectives, technical solutions, and advantages of the embodiments of the present disclosure more clearly, the technical solutions of the embodiments of the present disclosure will be clearly and comprehensively described in conjunction with the drawings of the embodiments of the present disclosure, obviously, the described embodiments are only some embodiments of the present disclosure, rather than all the embodiments. Based on the embodiments of the present disclosure, all other embodiments obtained by those of ordinary skill in the art without creative labor should fall into the protection scope of the present disclosure.

The flexible screen is a screen that can be bent to a certain extent. Because the flexible screen itself has certain flexibility, the flexible screen can not only display a plane like a conventional hard screen, but also bend within a certain range. The hard screen, due to limitation from its own material, can only form a plane or a display surface with a fixed curvature, which has limited application environment. The flexible screen can bend to different shapes to adapt to different object surfaces, which thus can be widely applied to wearable products and other new electronic products.

Figure 1:
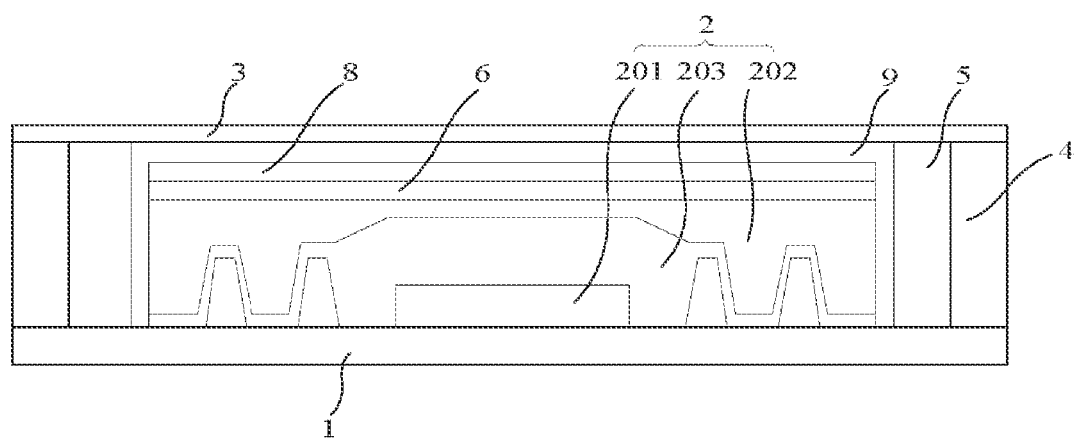
FIG. 1 is a schematic structural diagram of the flexible screen provided in the present disclosure.
Figure 2:
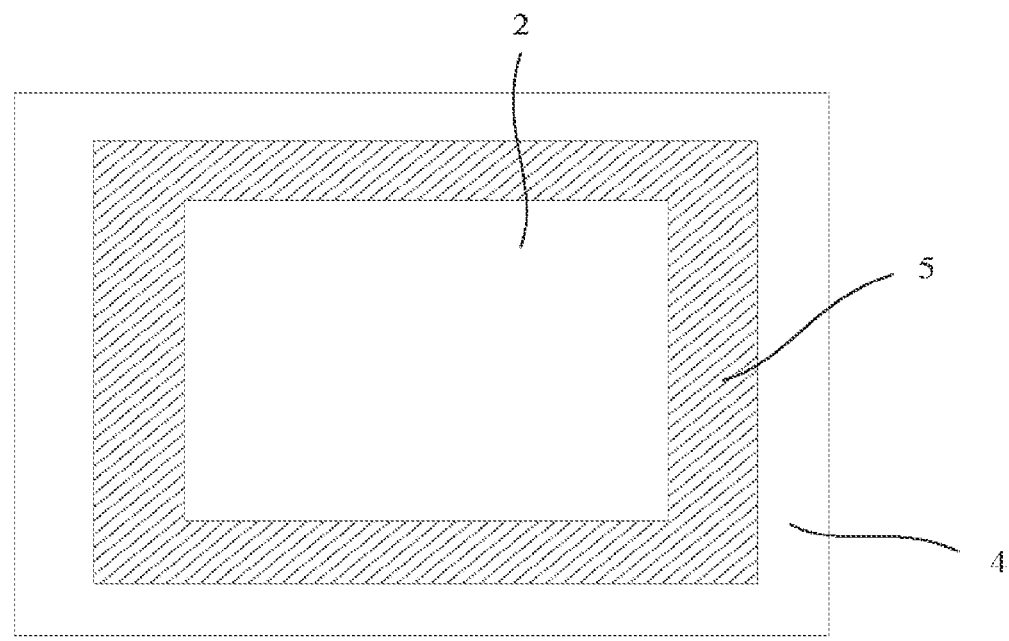
FIG. 2 is a schematic sealing diagram of a display unit in the flexible screen provided in the present disclosure.

FIG. 1 is a schematic structural diagram of a flexible screen provided in Embodiment 1 of the present disclosure. FIG. 2 is a schematic sealing diagram of a display unit of the flexible screen provided in this embodiment of the present disclosure. As shown in FIG. 1 and FIG. 2, the flexible screen provided in the present embodiment includes: a substrate 1, a display unit 2, and a cover plate 3, where the substrate 1 and the cover plate 3 are disposed oppositely, and the display unit 2 is located between the substrate 1 and the cover plate 3; and further includes a sealing layer 4 and an insulating flow blocking medium 5, where the sealing layer 4 is located between the substrate 1 and the cover plate 3, and surrounds a periphery of the display unit 2, a gap is formed between the sealing layer 4 and the display unit 2, the flow blocking medium 5 fills the gap to isolate the display unit 2 from the outside. In addition, an optical clear adhesive (OCA) 9 may also be disposed between the display unit 2 and the cover plate 3.

Specifically, the display unit 2 includes an array layer formed on the substrate 1 and a pixel layer formed on the array layer, and is encapsulated by an encapsulation layer 203, the cover plate 3 is adhered to the encapsulation layer by the optical clear adhesive 9. The flow blocking medium 5 is located in the gap between the optical clear adhesive 9 and the sealing layer 4. At this point, the optical clear adhesive 9 can isolate the flow blocking medium 5 outside thereof, and the optical clear adhesive 9 and the sealing layer 4 jointly enclose a dam-like structure, in this way, the flow blocking medium 5 can be accommodated in the dam structure enclosed by the optical clear adhesive 9 and the sealing layer 4, so that the flow blocking medium 5 is limited and accommodated in the flexible screen.

In other implementations, a touch component 6 and a polarizer 8 can also be disposed between the encapsulation layer 203 and the cover plate 3. As the content is familiar to those skilled in the art, details will not be repeated here.

The display unit 2 may specifically be divided into a display area 201, the encapsulation layer 203 enclosed outside the display area 201, and an encapsulation area 202. The array layer and the pixel layer jointly form the display area 201, the dam and the encapsulation layer 203 are arranged on the interior side of the encapsulation area 202, which are configured to realize the encapsulation of the display unit 2. The encapsulation area 202 has the optical clear adhesive which is configured to be adhered to the cover plate. For a specific structure of the display unit 2, the content is familiar to those skilled in the art, and will not be repeated here.

Specifically, in order to isolate each functional layer in the display unit 2 from outside water and oxygen, and prevent outside dust and liquid water from entering the inside of the flexible screen laterally to affect the overall performance of the flexible screen, in the present embodiment, a protection structure for sealing is further disposed outside the display unit 2, the protection structure mainly includes the sealing layer 4, the flow blocking medium 5, and other constituent parts. The sealing layer 4 may be enclosed at the periphery of the display unit 2, a gap is formed between the sealing layer 4 and the display unit 2, and the flow blocking medium 5 can be filled in the gap, for isolation from outside water and oxygen. The flow blocking medium 5 is an insulating medium, which thus does not conduct electricity, and may achieve electronical isolation of the display unit 2 from the outside. The sealing layer 4 is enclosed outside the flow blocking medium 5, which is used to jointly contain the flow blocking medium 5 with the display unit 2, thereby realizing the sealing and protection of the flow blocking medium 5.

The sealing layer 4 is formed on the substrate 1, and extends upwardly from the substrate 1 till a contact with the cover plate 3. In this way, the sealing layer 4 will effectively seal the space formed between the substrate 1 and the cover plate 3, thereby forming a relatively large sealing protection range, and realizing effective sealing and protection for each layer structure of the display unit 2 formed on the substrate 1 as well as the touch component 6 located between the display unit 2 and the cover plate 3, the polarizer 8, and other structures.

Meanwhile, in order to not affect the sealability of the screen body when the flexible screen is dynamically bent, the gap formed between the sealing layer 4 and the display unit 2 is filled with the flow blocking medium 5, such that the display unit 2 is isolated from the outside through the sealing layer 4 and the flow blocking medium 5. Compared to the approach in the prior art that foam is enclosed at the periphery of the display unit 2 only, in the present embodiment, the flow blocking medium 5 is filled in the gap between the sealing layer 4 and the display unit 2. Since the flow blocking medium 5 itself has shape deformability, the flow blocking medium 5 can be shape-adjusted with movement and deformation of the substrate 1, the cover plate 3, and the display unit 2 accordingly.

Compared to using only the sealing layer 4 to seal the periphery of the display unit 2, the method of filling the gap formed between the sealing layer 4 and the display unit 2 with the flow blocking medium 5 effectively avoids the problem that, due to displacement and deformation of various parts of the flexible screen during the bending process, the sealability at the periphery of the display unit 2 is affected, and improves the sealing stability at the periphery of the display unit 2, thereby preventing the outside water vapor and impurities from entering the inside of the flexible screen laterally.

The substrate 1 and the cover plate 3 are both made of a bendable flexible material (such as polyimide), in order to meet dynamic bending and folding requirements of the flexible screen.

The flow blocking medium 5 can be in a deformable non-solid form such as fluid, semi-fluid or gel, and has certain fluidity. Therefore, when the flexible screen is bent, the flow blocking medium 5 filled between the sealing layer 4 and the display unit 2 will deform with the bending of the substrate 1 and the cover plate 3 accordingly, so as to always maintain shape consistency with the gap between the sealing layer 4 and the display unit 2, in this way, the flow blocking medium 5 can always seal an area at the circumferential periphery of the display unit 2, preventing the display unit 2 from contacting outside impurities such as water and oxygen. In addition, when the substrate 1 and the cover plate 3 bend and deform, the flow blocking medium 5 can rely on its own fluidity to avoid stress, without affecting or damaging the screen body.

In the present embodiment, the flow blocking medium 5 may be insulating oil or lubricating oil to improve the sealability at the periphery of the display unit 2 when the flexible screen is bent, to ensure the dustproof and waterproof effects of the flexible screen, to ensure that the flow blocking medium 5 has certain insulating effects in case there is electricity leakage for the display unit 2, and to ensure the operational safety of the flexible screen. The insulating oil or the lubricating oil may be natural or synthetic oil, which for example, may be vegetable oil or mineral oil, etc. In the present embodiment, the existing insulating oil or lubricating oil can be used to seal the periphery of the flexible screen.

In addition, the flow blocking medium 5 may also be made of a material well-known to those skilled in the art, which has both an insulating property and certain flowing capability, and details will not be repeated here.

Specifically, the flow blocking medium 5 can be filled in the gap between the sealing layer 4 and the display unit 2 by means of injection or other filling methods, depending on the material of the flexible screen, the size of the gap between the sealing layer 4 and the display unit 2 and the sealing level, the flow blocking medium 5 may be made of a variety of materials with different physical and chemical properties. For example, the flow blocking medium 5 with different viscosities and other flow properties can be selected to fill the gap with different size.

Specifically, in order to ensure the isolating and sealing effects of the flow blocking medium 5 to the display unit 2, the gap between the sealing layer 4 and the display unit 2 will circumferentially surround the periphery of the display unit 2. In this way, circumferential edges of the display unit 2 in any direction will be protected by the flow blocking medium 5, and the flow blocking medium 5 has relative good sealing and isolating effects.

In order to avoid the condition that the flow blocking medium 5 surrounding the display unit 2 is interrupted due to a severe deformation of the gap between the sealing layer 4 and the display unit 2 when the flexible screen is bent to a relatively large extent, the gap between the sealing layer 4 and the display unit 2 should have sufficient width, so that the gap has a deformation margin sufficient enough to satisfy a situation where there is a guarantee that the flow blocking medium 5 always surrounds and protects the periphery of the display unit 2 when the flexible screen is bent, thereby achieving a relatively good sealing effect.

Optionally, the width of the gap between the sealing layer 4 and the display unit 2 may be allowed to vary with a bending deformation of the flexible screen, for example, there may be a relatively large bending deformation at a seam or a crease of the flexible screen, correspondingly, the width of the gap between the sealing layer 4 and the display unit 2 corresponding to this direction is greater than the width of the remaining portion of the gap, so as to avoid an interruption of the flow blocking medium 5 here resulting from the gap being closed with the bending of the flexible screen: accordingly, for the less deformed part of the flexible screen, the gap thereof may have a relatively small width. In addition, the gap between the sealing layer 4 and the display unit 2 can also be relatively uniform, for example, the gap has an equal width everywhere, in order to satisfy the sealing and waterproof performance when the flexible screen are bent in various directions.

Figure 3:
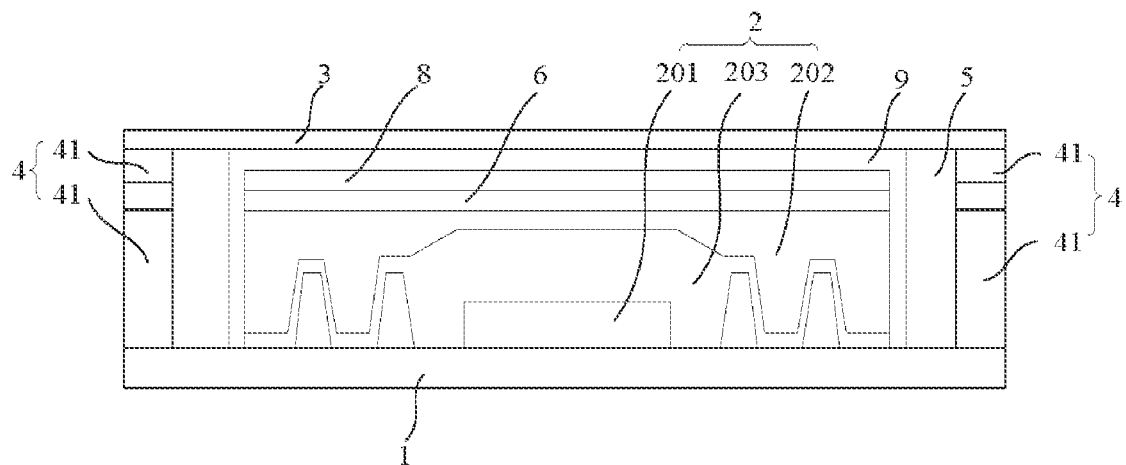
FIG. 3 is another schematic structural diagram of the flexible screen provided in the present disclosure.

FIG. 3 is another schematic structural diagram of the flexible screen provided in Embodiment 1 of the present disclosure. As shown in FIG. 3, in an optional implementation, the sealing layer 4 in the present embodiment includes at least two sealing sublayers 41, the at least two sealing sublayers 41 are laminatedly disposed in a direction perpendicular to the substrate 1, and are movable relative to each other.

Specifically, in the present embodiment, the sealing layer 4 is arranged such that at least two sealing sublayers 41 are laminatedly disposed in a direction perpendicular to the substrate 1, the at least two sealing sublayers 41 are movable relative to each other, therefore, when the flexible screen is dynamically bent, there is a relative movement between two adjacent sealing sublayers 41 during movement and deformation of the substrate 1, the display unit 2 and the cover plate 3, without causing the overall deformation and movement of the sealing layer 4 or even the detachment thereof from the periphery of the display unit 2, thereby improving the stability of the sealing layer 4 during the bending process, and ensuring the sealability of the flexible screen.

The shape and size of each sealing sublayer 41 can be set to a same one or a different one, as long as the sealabilty at the periphery of the display unit 2 can be ensured. Central axes of all laminatedly disposed sealing sublayers 41 perpendicular to the surface of the substrate 1 can either overlap or not overlap, that is, the sealing sublayers can be in a staggered arrangement.

In addition to the display unit 2, the flexible screen may further include a touch component, a polarizer and other layer structures, therefore, when the sealing layer 4 includes multiple sealing sublayer 41, the number of the sealing sublayers 41 can be correspondingly consistent with the number of layer structures in the flexible screen. For example, the display unit 2, the touch component 6, and the polarizer 8 are sequentially laminated between the substrate 1 and the cover plate 3 of the flexible screen, correspondingly, the sealing layer 4 has three sealing sublayers 41, and the three sealing sublayers 41 are respectively corresponding to the display unit 2, the touch component, and the polarizer. Generally, the number of the sealing sublayers 41 in the sealing layer 4 can be 2 to 4, in this way, the sealing sublayers 41 correspond to the layer structures such as the display unit 2, the touch component and the polarizer 8, and the sealing sublayers 41 will also move accordingly when the layer structures in the flexible screen slide relatively. The stress on the sealing sublayers 41 due to the bending of the flexible screen is relatively small, and the sealing effect is relatively good.

In order to block the flow blocking medium 5, the sealing layer 4 can usually be made using a flexible or elastic material such as foam. Because the foam itself has certain elasticity, the foam will correspondingly produce a certain deformation during dynamic bending of the flexible screen, thereby compensating for the deformation between the substrate 1 and the cover plate 3, and ensuring the sealability of the flow blocking medium 5 by effectively blocking the flow blocking medium 5 therein during the bending process of the flexible screen.

In order for the sealing layer 4 to have an effective blocking effect on the flow blocking medium 5 so as to avoid a situation that the flow blocking medium 5 penetrates into the sealing layer 4 or outflows from the sealing layer 4, optionally, the sealing layer 4 in the present embodiment may be made of closed-cell foam.

Specifically, the closed-cell foam may have a relatively high percentage (for example, 100%) of close area, and have a relatively smooth surface, which makes it not easy for the flow blocking medium 5 or other impurities to enter. By applying the closed-cell foam as the sealing layer 4 in the present embodiment, the sealing effect of the sealing layer 4 to the periphery of the display unit 2 can be ensured. Meanwhile, the closed-cell foam has an effective blocking effect on the flow blocking medium 5, which effectively prevents the flow blocking medium 5 from penetrating into the sealing layer 4, such that the flow blocking medium 5 can be stably accommodated between the edge of the display unit 2 and the sealing layer 4 to ensure the sealing and buffering effects thereof, meanwhile, the inability of the flow blocking medium 5 to enter the sealing layer 4 also further prevents the sealing performance of the sealing layer 4 from being affected.

In addition, because the foam itself has a porous structure, the outside water vapor and impurities can enter the foam through foam pores, and remain inside the foam; meanwhile, in an environment with high temperature and high humidity, the outside water vapor is easy to penetrate into the gap from the foam pores. In order to avoid penetration of outside water and oxygen and impurities, optionally, the sealing layer 4 in the present embodiment can also be made of silicon or thermoplastic urethane (TPU) elastomer rubber, such that the moisture resistance, water resistance, radiation resistance and weather resistance of the sealing layer 4 are improved, thereby improving the overall performance of the flexible screen.

When the sealing layer 4 is made of silicon or TPU, on one hand, the silicon and the TPU have a relatively compact material, for both of which, it is not easy to allow the outside water vapor or impurities to penetrate in, and the silicon and the TPU themselves have a certain degree of viscosity, which facilitate connection with the substrate 1 or the cover plate 3: on the other hand, the silicon or the TPU has a relatively soft material, which may easily generate a corresponding deformation with the bending of the flexible screen.

For the sealing layer 4 made of the silicon or the TPU, the overall height thereof is equivalent to the height between the cover plate 3 and the substrate 1, so that the sealing layer 4 can seal all the gaps between the cover plate 3 and the substrate 1, thus preventing the sealing layer 4 from forming a gap or a break between the cover plate 3 and the substrate 1.

Figure 4:
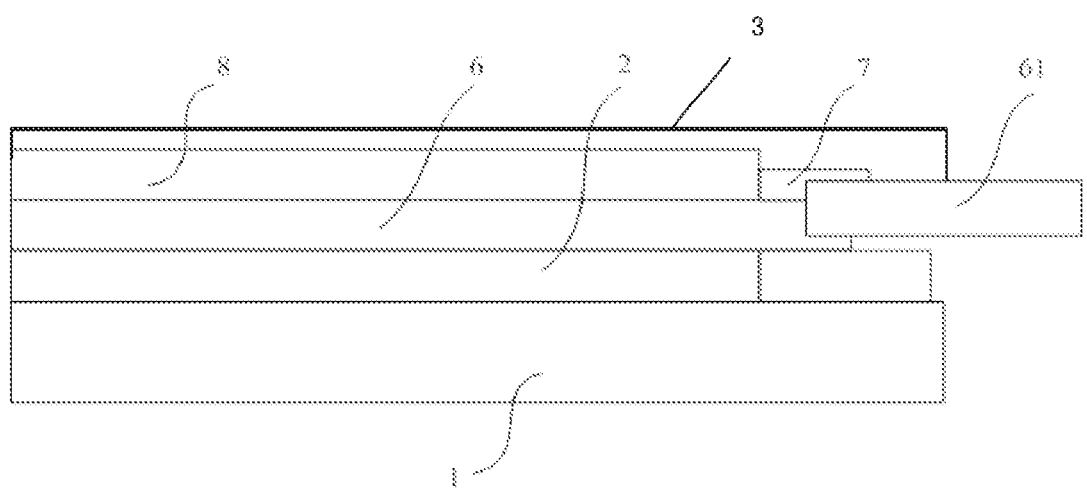
FIG. 4 is a schematic sealing structural diagram of a touch component in the flexible screen provided in the present disclosure.

FIG. 4 is a schematic sealing structural diagram of a touch component in the flexible screen provided in Embodiment 1 of the present disclosure. As shown in FIG. 4, in order to achieve the touch operation of the flexible screen, the flexible screen in the present embodiment may further includes a touch component 6 and a first flexible circuit board 61; the touch component 6 is disposed between the display unit 2 and the cover plate 3, the first flexible circuit board 61 and the touch component 6 are signal-connected, and an encapsulation coating 7 is disposed at a junction of the touch component 6 and the first flexible circuit board 61.

The touch component 6 in the present embodiment is a control component which is configured to perform a function switch on the display unit 2 of the flexible screen, the touch component 6 and the first flexible circuit board 61 are signal-connected, and an electrical signal is provided to the touch component 6 via the first flexible circuit board 61.

Specifically, in order to prevent dust or water vapor from entering the inside of the flexible screen through the junction of the touch component 6 and the first flexible circuit board 61, in the present embodiment, the encapsulation coating 7 used for waterproofing is disposed at the junction of the touch component 6 and the first flexible circuit board 61, which ensures the sealability at the connection of the touch component 6 and the first flexible circuit board 61, and meanwhile has a relatively thin thickness, thereby capable of avoiding interference on the upper structure of the cover plate 3.

The encapsulation coating 7 can be made of a liquid polymer material, when disposing the encapsulation coating 7, the liquid polymer material of the encapsulation coating 7 may be pre-polymerized, and after its molecular weight reaches a certain level (e.g. around 1000), the liquid polymer material is coated at the junction of the touch component 6 and the first flexible circuit board 61, and then the encapsulation coating 7 is further cured by a curing technology, the curing enables the encapsulation coating 7 to reach a higher molecular weight (ten thousands), where the curing technology may include means such as heat curing, etc.

Optionally, the encapsulation coating 7 has a thickness of 0.5-20 μm. In the present embodiment, by setting the thickness of the encapsulation coating 7 within this range, the encapsulation coating 7 has a relatively thin thickness, and there will be no interference with the upper structure of the cover plate 3, ensuring the waterproof effect of the encapsulation coating 7.

The encapsulation coating 7 can be a polyurethane coating, an acrylate coating, an epoxy resin coating or a dodecafluoroheptyl methacrylate coating, or a coating with waterproof performance that is well-known to those skilled in the art, etc., and there is no limitation here.

Since the polyurethane coating, the acrylate coating, the epoxy resin coating or the dodecafluoroheptyl methacrylate coating itself has relatively good chemical stability, weather resistance, hydrolysis resistance, high-temperature resistance, strong adhesion, and other characteristics, the use thereof as the encapsulation coating 7 for coating at the junction of the touch component 6 and the first flexible circuit board 61 can effectively improve the overall performance of the encapsulation coating 7, thereby ensuring the waterproof and sealing effects of the encapsulation coating 7 at the junction of the touch component 6 and the first flexible circuit board 61. Certainly, the encapsulation coating 7 can also be made of other materials, such as polyimide, etc.

Figure 5:
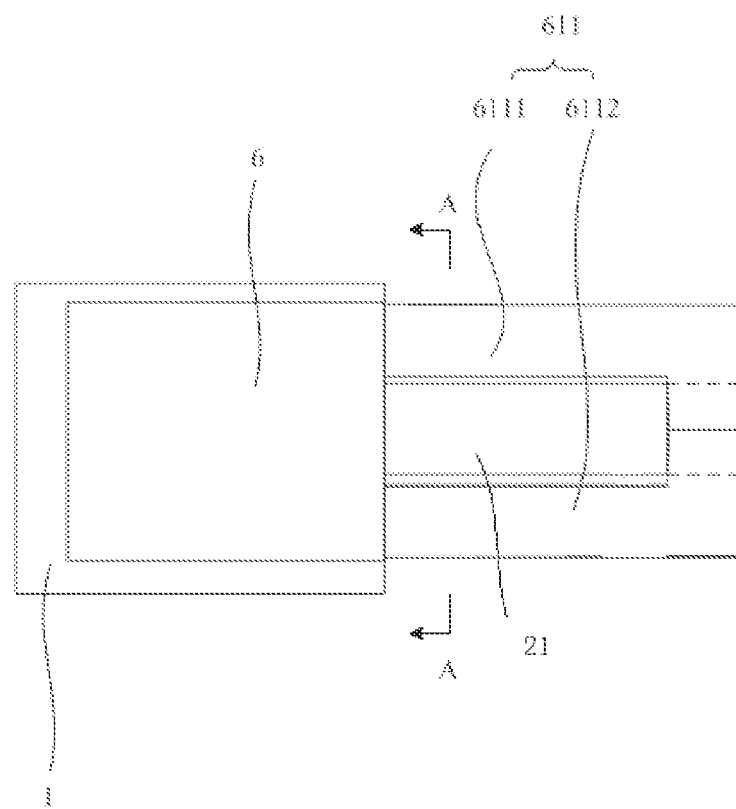
FIG. 5 is a schematic positional diagram of a flexible circuit board in the flexible screen provided in the present disclosure.
Figure 6:
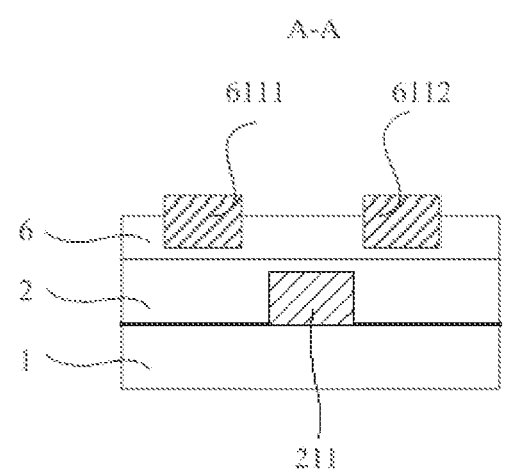
FIG. 6 is a schematic cross section at A-A in FIG. 5.

Besides, in order to allow for signal transmission of the display unit 2 with the outside, a second flexible circuit board is further disposed in the flexible screen, the second flexible circuit board is configured to transmit a signal of the display unit 2. FIG. 5 is a schematic positional diagram of a flexible circuit board in the flexible screen provided in Embodiment 1 of the present disclosure. FIG. 6 is a schematic cross section at A-A in FIG. 5. As shown in FIG. 5 and FIG. 6, optionally, the flexible screen in the present embodiment can further include a second flexible circuit board 21: the first flexible circuit board 61 has a first connection terminal 611 connected to the touch component 6, the second flexible circuit board 21 has a second connection terminal 211 connected to a terminal of the substrate 1, the first connection terminal 611 and the second connection terminal 211 do not overlap each other in a direction perpendicular to the surface of the substrate 1.

In the prior art, the first flexible circuit board 61 connected to the touch component 6 and the second flexible circuit board 21 connected to the terminal of the display unit 2 are arranged such that they vertically overlap in a direction perpendicular to the surface of the substrate 1, at this point, there will be a minor gap or seam between the first flexible circuit board 61 and the second flexible circuit board 21, since the seam is relatively narrow, it is difficult to perform a good assembly. On this basis, in order to ensure the assembly effect at the first connection terminal 611 and the second connection terminal 211, it is necessary to perform an assembly on the gap formed between the first flexible circuit board 61 and the second flexible circuit board 21, however, because the gap is relatively narrow, the entire assembly process is more difficult, thereby affecting the assembly effect, and resulting in poor dustproof performance.

In order to solve the above problem, in the present embodiment, the first connection terminal 611 of the first flexible circuit board 61 and the second connection terminal 211 of the second flexible circuit board 21 are arranged such that they do not overlap each other in a direction perpendicular to the surface of the substrate 1, in other words, the first flexible circuit board 61 and the second flexible circuit board 21 are in a staggered arrangement, which effectively avoids a situation that the assembly process becomes more difficult due to a relatively small gap between the first flexible circuit board 61 and the second flexible circuit board 21 when they overlap.

Specifically, after the first flexible circuit board 61 and the second flexible circuit board 21 are disposed in the above manner, generation of an overlapped area between the first flexible circuit board 61 and the second flexible circuit board 21 is avoided so that the assembly process is simplified and the dustproof effect becomes better.

As shown in FIG. 6, the first connection terminal 611 of the first flexible circuit board 61 may be configured to have a first connection portion 6111 and a second connection portion 6112, where the first connection portion 6111, the second connection terminal 211 and the second connection portion 6112 are arranged in parallel along a direction perpendicular to the surface of the substrate 1, and the second connection terminal 211 is located between the first connection portion 6111 and the second connection portion 6112.

In this way, the first connection terminal 611 of the first flexible circuit board 61 for connection with the touch component of the flexible screen is divided into two parts to form the first connection portion 6111 and the second connection portion 6112, so that the first connection portion 6111, the second connection terminal 211 and the second connection portion 6112 are arranged in parallel along a direction perpendicular to the surface of the substrate 1, that is, a projection of the second connection terminal 211 in the second flexible circuit board 21 is located between projections of the first connection portion 6111 and of the second connection portion 6112, in this way, the first connection terminal 611 of the first flexible circuit board 61 and the second connection terminal 211 of the second flexible circuit board 21 are staggered in a direction perpendicular to the substrate 1, there is no longer a relatively small gap among the second connection terminal 211, the first connection portion 6111 and the second connection portion 6112, the process of assembly with the touch component 6 and the terminal of the substrate 1 is more convenient and easier, and the flexible screen has a relatively good dustproof effect.

Besides, in the first flexible circuit board 61, division of the first connection portion 6111 and the second connection portion 6112 is performed only at the first connection terminal 611, while at the terminal for connection with the outside, the first connection portion 6111 and the second connection portion 6112 will rejoin into the same terminal.

In the present embodiment, by using the sealing layer 4 and the flow blocking medium 5, the sealing and waterproof performance of the flexible screen can be effectively improved to achieve a relatively high waterproof and sealing level, where the flexible screen can reach a waterproof level of IP68.

In the present embodiment, the flexible screen includes: a substrate, a display unit and a cover plate, where the display unit is located between the substrate and the cover plate; and further includes a sealing layer and an insulating flow blocking medium, where the sealing layer is located between the substrate and the cover plate, and surrounds a periphery of the display unit, a gap is formed between the sealing layer and the display unit, the flow blocking medium fills the gap to isolate the display unit from the outside. In the present embodiment, by filling the flow blocking medium into the gap formed between the sealing layer and the display unit, the flow blocking medium with relatively good deformability can be used to seal a sealing area at the periphery of the display unit, so that even the flexible screen is bent, the flow blocking medium also can perform a corresponding shape adjustment effectively to ensure that the flexible screen has good waterproof and sealing performance during the use.

The present embodiment provides a display device including the flexible screen described above. The specific structure, function and working principle of the flexible screen have been described in detail in the above mentioned embodiment, and will not be repeated here.

In the present embodiment, the above-mentioned flexible screen is provided on the display device, so that it is difficult to seal the circumference of the display unit due to displacement and deformation of the substrate, the display unit or the cover plate when the flexible screen of the display device is bent, improving the sealing effect of the flexible screen when it is dynamically bent, preventing the outside water vapor and impurities from entering the inside of the flexible screen laterally, thereby improving the overall quality of the display device.

Finally, it should be noted that: the embodiments above are merely to illustrate but not to limit the technical solutions of the present disclosure; although the present disclosure has been described in detail with reference to the above embodiments, those of ordinary skill in the art should understand that they may still make modifications to the technical solutions described in the above embodiments, or make equivalent substitutions to some or all technical features therein; however, there modifications or substitutions do not cause the essence of the corresponding technical solutions to depart from the scope of the technical solutions in the embodiments of the present disclosure.

What is claimed is:
1. A flexible screen, comprising:
a substrate;
a cover plate;
a display unit located between the substrate and the cover plate;
a sealing layer located between the substrate and the cover plate, and surrounding a periphery of the display unit, wherein the sealing layer comprises at least two sealing sublayers, disposed as stacked on each other in a direction perpendicular to the substrate, that are configured to move relative to each other;

wherein a number of sealing sublayers corresponds to a number of layer structures in the flexible screen; and flow blocking medium, wherein a gap is formed between the sealing layer and the display unit, and the flow blocking medium fills the gap to isolate the display unit from outside.

2. The flexible screen according to claim 1, wherein the gap surrounds a circumferential periphery of the display unit.

3. The flexible screen according to claim 1, wherein the display unit comprises an array layer formed on the substrate and a pixel layer formed on the array layer, the display unit is encapsulated by an encapsulation layer, and the cover plate is adhered to the encapsulation layer by an optical clear adhesive.

4. The flexible screen according to claim 3, wherein the optical clear adhesive has its edge extending toward the substrate to form a sealed lateral side, and the sealed lateral side wraps a film layer between the substrate and the optical clear adhesive.

5. The flexible screen according to claim 4, wherein the flow blocking medium is located in the gap between the optical clear adhesive and the sealing layer.

6. A display device, comprising the flexible screen according to claim 1.

7. The flexible screen according to claim 1 wherein the display unit comprises at least two functional layers that are sequentially laminated in a direction perpendicular to the substrate and one of the sealing sublayers is disposed at a periphery of each of the at least two functional layers.

8. The flexible screen according to claim 1, wherein a width of the gap at a first position of the flexible screen is greater than a width of the gap at a second position of the flexible screen and a deformation of the flexible screen at the first position of the flexible screen is greater than a deformation of the flexible screen at the second position of the flexible screen when the flexible screen is bent.

9. The flexible screen according to claim 3, wherein the sealing layer is formed on the substrate, and extends upwardly from the substrate till contacting with the cover plate.

10. The flexible screen according to claim 1, wherein the flow blocking medium is made of a material with an insulating property and with fluidity.

11. The flexible screen according to claim 1, wherein the sealing layer comprises closed-cell foam and the flow blocking medium is insulating oil or lubricating oil.

12. The flexible screen according to claim 1, wherein the sealing layer comprises silicon or thermoplastic urethane elastomer rubber.

13. The flexible screen according to claim 1, further comprising:
a touch component; and
a first flexible circuit board, wherein the touch component is disposed between the display unit and the cover plate, the first flexible circuit board and the touch component are signal-connected, and an encapsulation coating is disposed at a junction of the touch component and the first flexible circuit board.

14. The flexible screen according to claim 2, further comprising:
a touch component; and
a first flexible circuit board, wherein the touch component is disposed between the display unit and the cover plate, the first flexible circuit board and the touch component are signal-connected, and an encapsulation coating is disposed at a junction of the touch component and the first flexible circuit board.

15. The flexible screen according to claim 14, wherein the encapsulation coating has a thickness of 0.5-20 μm.

16. The flexible screen according to claim 14, wherein the encapsulation coating is a polyimide coating.

17. The flexible screen according to claim 14, further comprising:
a second flexible circuit board which is configured to transmit a signal of the display unit.

18. The flexible screen according to claim 17, wherein the first flexible circuit board has a first connection terminal connected to the touch component, the second flexible circuit board has a second connection terminal connected to a terminal of the substrate, the first connection terminal and the second connection terminal do not overlap with each other in a direction perpendicular to the substrate.

19. The flexible screen according to claim 18, wherein the first connection terminal has a first connection portion and a second connection portion arranged in parallel along an extending direction of the substrate and the second connection terminal is located between the first connection portion and the second connection portion.

* * * * *